US009648059B2

(12) United States Patent
Nysetvold et al.

(10) Patent No.: US 9,648,059 B2
(45) Date of Patent: May 9, 2017

(54) SYSTEM AND METHODS FOR MULTI-USER CAX EDITING CONFLICT MANAGEMENT

(71) Applicant: Brigham Young University, Provo, UT (US)

(72) Inventors: Thomas Trevor Nysetvold, The Woodlands, TX (US); Ammon Hepworth, Provo, UT (US); Charles Gregory Jensen, Provo, UT (US)

(73) Assignee: BRIGHAM YOUNG UNIVERSITY, Provo, UT (US)

( * ) Notice: Subject to any disclaimer, the term of this patent is extended or adjusted under 35 U.S.C. 154(b) by 383 days.

(21) Appl. No.: 14/173,648

(22) Filed: Feb. 5, 2014

(65) Prior Publication Data

US 2014/0222919 A1 Aug. 7, 2014

Related U.S. Application Data

(60) Provisional application No. 61/760,713, filed on Feb. 5, 2013.

(51) Int. Cl.
| | |
|---|---|
| *H04L 29/06* | (2006.01) |
| *G06F 17/50* | (2006.01) |
| *H04L 12/58* | (2006.01) |
| *G06Q 10/10* | (2012.01) |

(52) U.S. Cl.
CPC ............ *H04L 65/403* (2013.01); *G06F 17/50* (2013.01); *G06Q 10/101* (2013.01); *H04L 51/046* (2013.01)

(58) Field of Classification Search
CPC ..... G06F 2217/04; G06F 17/50; H04L 51/046
See application file for complete search history.

(56) References Cited

U.S. PATENT DOCUMENTS

| | | | |
|---|---|---|---|
| 6,341,291 B1 | 1/2002 | Bentley et al. | |
| 7,881,535 B1 * | 2/2011 | McLaughlin | G06Q 40/02 382/186 |
| 7,949,990 B2 * | 5/2011 | Pfeil | G06F 17/50 715/733 |
| 8,229,579 B2 | 7/2012 | Eldridge et al. | |
| 8,326,924 B1 * | 12/2012 | Lunenfeld | G06F 17/30864 709/203 |
| 8,751,464 B1 * | 6/2014 | Weiss | G06Q 10/10 707/695 |

(Continued)

OTHER PUBLICATIONS

PCT/US2014/014946, International Search Report and Written Opinion, Jun. 27, 2014.

*Primary Examiner* — Lashonda Jacobs

(57) ABSTRACT

A multi-user CAx editing system may comprise a plurality of editing clients and a collaborative editing server. The server and editing clients may be collectively configured to: a) assign a feature to a first user, detect an attempt to edit the feature by a second user, and reassign the feature to the second user if the first user indicates that the feature may be reassigned, and/or b) detect an editing conflict between a first and second user for a feature and send a reversion request for the feature to one or more clients and/or c) initiate changes for a feature within a remote instance of the electronic model edited by another user and initiate reversion of the changes for the feature within a local instance of the electronic model in response to determining that the changes to the feature within the remote instance of the electronic model generated an error.

19 Claims, 7 Drawing Sheets

(56) References Cited

U.S. PATENT DOCUMENTS

| | | | |
|---|---|---|---|
| 9,270,478 B2* | 2/2016 | Red | H04L 12/2803 |
| 9,292,261 B1* | 3/2016 | Bouldin | G06F 8/20 |
| 9,298,715 B2* | 3/2016 | Kumarasamy | G06F 17/30088 |
| 2003/0131332 A1* | 7/2003 | Pfeil | G06F 17/5068 |
| | | | 716/102 |
| 2004/0210854 A1* | 10/2004 | Pfeil | G06F 17/50 |
| | | | 6/102 |
| 2005/0160396 A1* | 7/2005 | Chadzynski | G06F 9/541 |
| | | | 7/103 |
| 2010/0082580 A1* | 4/2010 | DeFrang | G06F 17/2288 |
| | | | 707/706 |
| 2012/0110087 A1 | 5/2012 | Culver et al. | |
| 2012/0317497 A1* | 12/2012 | Red | G06F 17/50 |
| | | | 715/751 |
| 2013/0131840 A1* | 5/2013 | Govindaraj | G05B 19/41865 |
| | | | 700/19 |
| 2013/0239011 A1* | 9/2013 | Red | G06F 17/50 |
| | | | 715/743 |
| 2013/0346506 A1* | 12/2013 | Zimmerman | G06Q 10/06 |
| | | | 709/205 |
| 2014/0118223 A1* | 5/2014 | Jensen | G06F 3/048 |
| | | | 345/2.2 |
| 2014/0149882 A1* | 5/2014 | Nysetvold | H04L 65/403 |
| | | | 715/751 |
| 2014/0238550 A1* | 8/2014 | Inoue | C22C 45/08 |
| | | | 148/403 |
| 2014/0282826 A1* | 9/2014 | Bastide | G06F 17/30011 |
| | | | 726/1 |
| 2014/0344715 A1* | 11/2014 | Beerse | G06Q 10/109 |
| | | | 715/753 |

* cited by examiner

SYSTEM AND METHODS FOR MULTI-USER CAX EDITING CONFLICT MANAGEMENT

RELATED APPLICATIONS

This application claims priority to U.S. provisional application 61/760,713 entitled "Real-Time Conflict Management for Multi-User CAD" and filed on 5 Feb. 2013. The foregoing application is incorporated herein by reference.

BACKGROUND OF THE INVENTION

Field of the Invention

The claimed invention relates to computer aided technologies (CAx) such as computer aided design, engineering, analysis and manufacture in general and apparatus, systems, means, and methods for multi-user CAx editing in particular.

Description of the Related Art

Large design and engineering projects require coordination of the efforts of many designers or engineers. Designers and engineers may have various CAx tools that they have experience with, have been trained to use, or simply prefer. Existing CAx data may have been created using still other CAx tools. Each of these CAx tools may have incompatible file formats.

Existing CAx systems, however, are not well-suited to collaborative design and editing. For example, data files that are shared among several designers and edited by them may create editing conflicts that often result in data loss and/or corruption.

Accordingly, the present invention identifies and addresses a need for additional and improved systems and methods for multi-user CAx editing conflict detection and management.

BRIEF SUMMARY OF THE INVENTION

The embodiments disclosed herein have been developed in response to the present state of the art, and in particular, in response to the problems and needs in the art that have not yet been fully solved by currently available multi-user CAx editing systems and methods. Accordingly, the claimed inventions have been developed to provide methods and systems for multi-user CAx editing conflict management that overcome shortcomings in the art.

In one example, a multi-user CAx editing system comprises a plurality of editing clients and a collaborative editing server. The editing clients and the server may be collectively configured to execute various conflict management methods including: a) assigning a feature to a first user, detecting an attempt to edit the feature by a second user, and reassigning the feature to the second user if the first user indicates that the feature may be reassigned, and/or b) detecting an editing conflict between a first and second user for a feature and sending a reversion request for the feature to one or more clients and/or c) initiating changes for a feature within a second instance of the electronic model (e.g., a remote instance that is edited by another user) and initiating reversion of the changes for the feature within a first instance of the electronic model edited by a first user (e.g., a local instance) in response to determining that the changes to the feature within the second instance of the electronic model generated an error.

It should be noted that references throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

The described features, advantages, and characteristics of the invention may be combined in any suitable manner in one or more embodiments. One skilled in the relevant art will recognize that the invention may be practiced without one or more of the specific features or advantages of a particular embodiment. In other instances, additional features and advantages may be recognized in certain embodiments that may not be present in all embodiments of the invention.

These features and advantages will become more fully apparent from the following description and appended claims, or may be learned by the practice of the invention as set forth hereinafter.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE INVENTION

Figure 1:
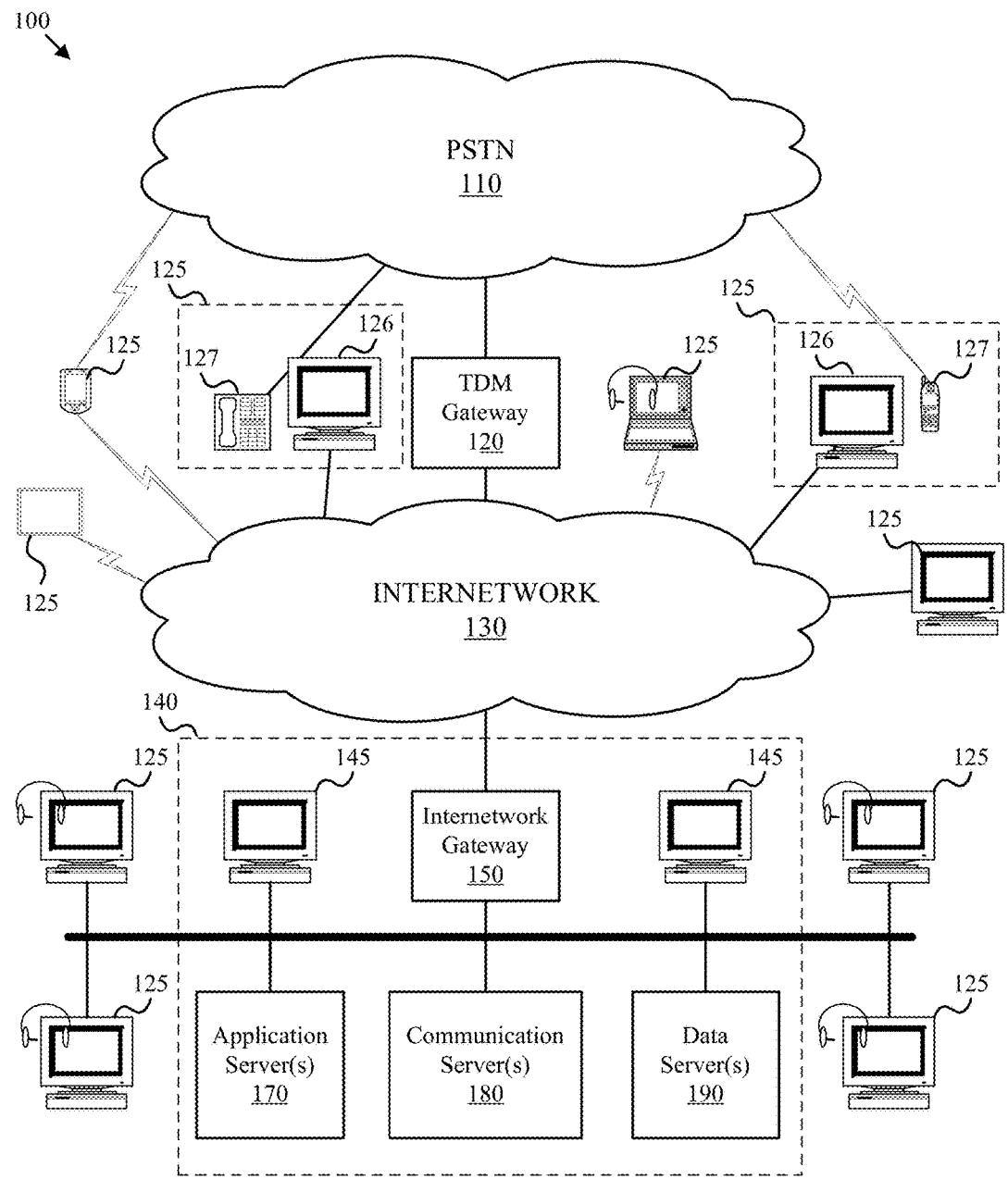
FIG. 1 is a block diagram of one example of a computing and communications infrastructure.

Some of the functional units described in this specification have been labeled as modules, in order to more particularly emphasize their implementation independence. Others are assumed to be modules. For example, a module or similar unit of functionality may be implemented as a hardware circuit comprising custom VLSI circuits or gate arrays, off-the-shelf semiconductors such as logic chips, transistors, or other discrete components. A module may also be implemented with programmable hardware devices such as field programmable gate arrays, programmable array logic, programmable logic devices or the like.

A module or a set of modules may also be implemented (in whole or in part) as a processor configured with software to perform the specified functionality. An identified module may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, the executable code of a module may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices.

Reference throughout this specification to "one embodiment," "an embodiment," or similar language means that a particular feature, structure, or characteristic described in connection with the embodiment is included in at least one embodiment of the present invention. Thus, appearances of the phrases "in one embodiment," "in an embodiment," and similar language throughout this specification may, but do not necessarily, all refer to the same embodiment.

Reference to a computer readable medium may take any tangible form capable of enabling execution of a program of machine-readable instructions on a digital processing apparatus. For example, a computer readable medium may be embodied by a flash drive, compact disk, digital-video disk, a magnetic tape, a Bernoulli drive, a magnetic disk, a punch card, flash memory, integrated circuits, or other digital processing apparatus memory device. A digital processing apparatus such as a computer may store program codes, associated data, and the like on the computer readable medium that when retrieved enable the digital processing apparatus to execute the functionality specified by the modules.

Furthermore, the described features, structures, or characteristics of the invention may be combined in any suitable manner in one or more embodiments. In the following description, numerous specific details are provided, such as examples of programming, software modules, user selections, network transactions, database queries, database structures, hardware modules, hardware circuits, hardware chips, etc., to provide a thorough understanding of embodiments of the invention. One skilled in the relevant art will recognize, however, that the invention may be practiced without one or more of the specific details, or with other methods, components, materials, and so forth. In other instances, well-known structures, materials, or operations are not shown or described in detail to avoid obscuring aspects of the invention.

FIG. 1 is a block diagram of one example of a computing and communications infrastructure 100 that is consistent with one or more embodiments of the claimed invention. As depicted, the infrastructure 100 includes various systems, subsystems, and networks such as a public switched telephone network (PSTN) 110, a TDM gateway 120 connecting the PSTN to an inter-network 130, a variety of workstations 125, a data center 140 with administrative terminals 145, an inter-network gateway 150 connecting a local area network to the inter-network 130, and various servers such as application servers 170, communication servers 180, and data servers 190. The infrastructure 100 is one example of components that can be operably interconnected to provide an infrastructure for a computer-aided design, computer-aided engineering, or computer-aided manufacturing (CAx) system that includes a collaborative CAx editing system.

Each workstation 125 may include a separate computing device 126 and a communications device 127 or the computing device and communications device may integrated into the workstation 125. Examples of the communications device 127 include a phone, a VOIP device, an instant messaging device, a texting device, a browsing device, and the like. The computing devices 126 may enable graphical view selection. The communications devices 127 may enable users to communicate with other CAx system users.

The inter-network 130 may facilitate electronic communications between the various workstations and servers. In one embodiment, the inter-network 130 is the internet. In another embodiment, the inter-network 130 is a virtual private network (VPN).

Various servers such as blade servers within the data center 140 function cooperatively to facilitate concurrent collaborative editing of CAx models by local and remote users. For example, the application servers 170 may provide one or more CAx applications to the local and remote users. Some users may have the CAx applications installed on their local computing devices 126. Examples of CAx applications include Siemens NX, MSC Nastran, Dessault Systems CATIA and Solidworks, ANSYS, and the like.

The communication servers 180 may facilitate communications between the users through various channels or services such as VOIP services, email services, instant messaging services, short message services, and text messaging services. The workstations 125 may leverage such services for user to user communications via the communication servers 180 or via other available service platforms.

The data servers 190 or the like may store CAx models within various model files or records. The data servers may replicate copies of the models for use by various users. Some users may have a local copy of a model. As described herein, instead of requiring a particular user to assume control of a model file or record, updates to the model may be coordinated by one or more CAx applications including client versions, server versions, and cloud versions of such applications.

Figure 2:
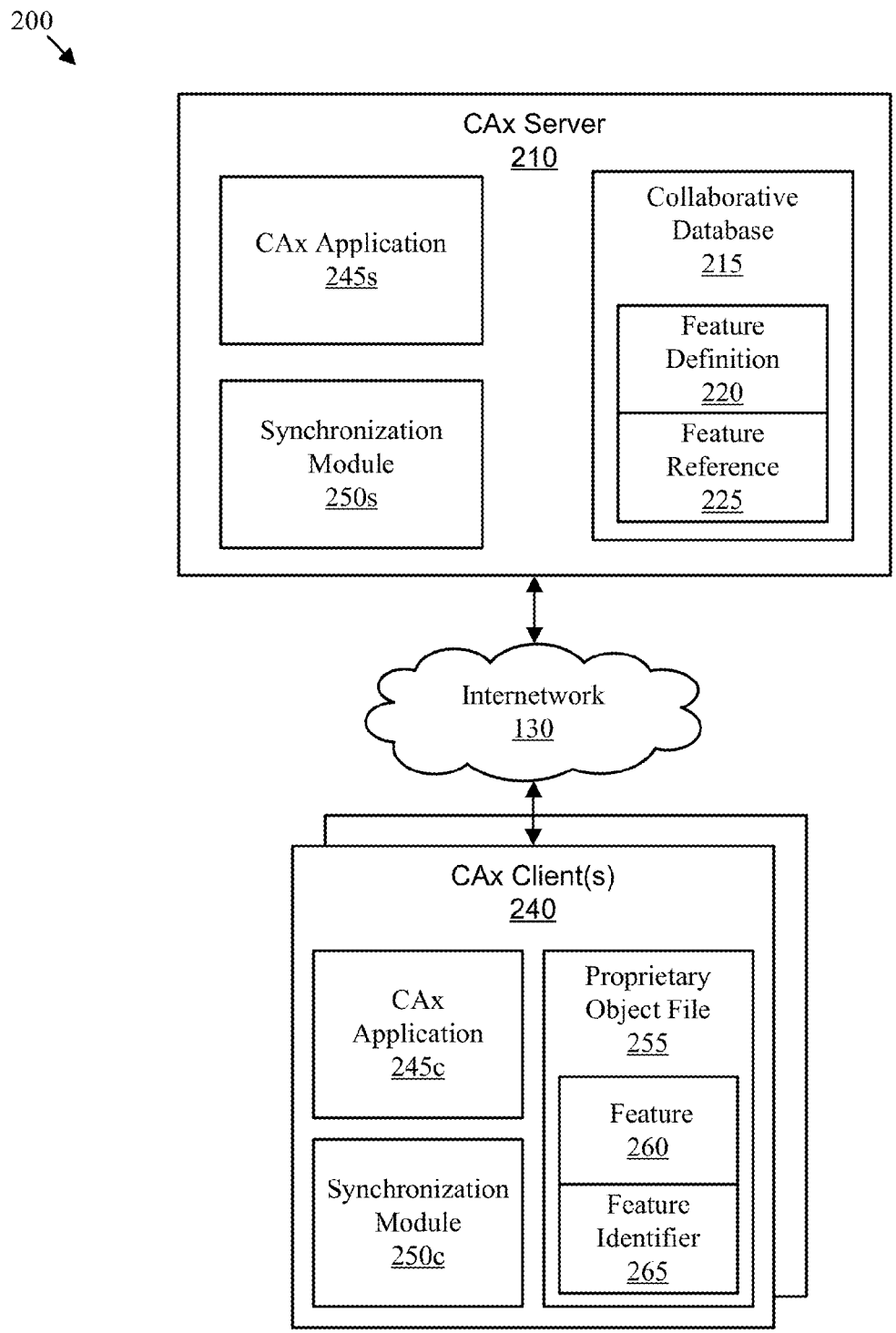
FIG. 2 is a schematic diagram illustrating one embodiment of a collaborative CAx editing system.

FIG. 2 is a block diagram of one example of a collaborative CAx editing system 200 that is consistent with one or more embodiments of the claimed invention. As depicted, and as will be explained in greater detail below, the collaborative CAx editing system 200 may include one or more CAx clients 240 with at least one processor that may execute a proprietary CAx application 245 and associated modules and enable editing of a proprietary representation of an engineering object by a user.

The collaborative CAx editing system 200 may also include a collaborative CAx server 210 that may store an operations log of the engineering object. Collaborative CAx editing system 200 may also include a synchronization module 250 that may detect creation of a proprietary feature 260 of the engineering object within the proprietary CAx application 245 and insert a feature identifier 265 corresponding to the feature within the proprietary representation of the engineering object. The feature identifier 265 may correspond to, or be identical to, the feature reference 225.

As illustrated in FIG. 2, collaborative CAx editing system 200 may also include one or more data stores, such as proprietary object file 255 or collaborative database 215. In one embodiment, proprietary object file 255 may be configured to store a proprietary representation of an engineering object. Collaborative database 215 may be configured to store an operations log of the engineering object. Proprietary object file 255 and collaborative database 215 may represent portions of a single database or computing device or a plurality of databases or computing devices. For example, collaborative database 215 may represent portions of the computing and communications infrastructure 100 in FIG. 1.

Each of the modules may reside on a single computing device (i.e. node) or be collaboratively partitioned onto multiple devices or nodes. For example, in the depicted embodiment the CAx application 245 is partitioned into a CAx application client 245c and a CAx application service 245s. Similarly, the synchronization module 250 is partitioned into a client module 250c and a server module 250s. The modules may be primarily or wholly comprised of software codes and associated data that are executed and processed by a digital processing apparatus such as a computer to provide the specified functionality.

Figure 3:
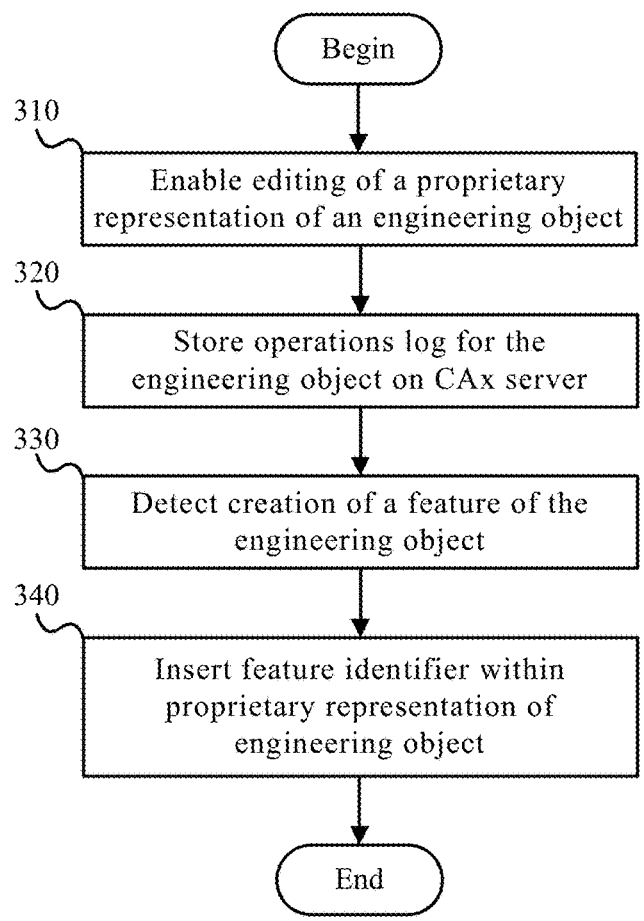
FIG. 3 is a flowchart diagram of one example of a collaborative CAx editing method.

FIG. 3 is a flow diagram of a collaborative CAx editing method 300. The steps (i.e., operations) shown in FIG. 3 may be performed by any suitable computer-executable code and/or computing system and in some cases need not be executed sequentially or in the depicted order. In some embodiments, the steps shown in FIG. 3 may be performed by one or more components of computing and communications infrastructure 100 in FIG. 1, system 200 in FIG. 2, and/or system 400 in FIG. 4.

As illustrated in FIG. 3, at step 310 one or more of the systems described herein may execute a proprietary CAx application and enable editing of a proprietary representation of an engineering object by a user. For example, at step 310 CAx client 240 may, as part of computing device 200 in FIG. 2, execute CAx application 245 and enable editing of a proprietary representation of an engineering object by a user. CAx application 245 may store the proprietary representation of the engineering object in proprietary object file 255. The proprietary representation may include one or more features of the engineering object, such as proprietary feature 260.

As used herein, the phrase "engineering object" generally refers to a conceptual design produced to show the look or function of an object before it is built or made. The design may be incorporated in representations such as plans, drawings, diagrams, schematics, blueprints, sketches, maps, or models. The design may include one or more "features," i.e., distinctive CAx attributes that may be represented by one or more geometries or parameters. Examples of features include the shape, dimensions, composition, material properties and tolerances of an object or portion of an object, the mesh size and required accuracy for simulations, the path and tolerances for a manufacturing tool, and any other attribute that may affect the performance of a product and the manufacture thereof.

As used herein, the phrase "proprietary representation" generally refers to a data format associated with a CAx application. A proprietary representation of an engineering object may be vendor specific and typically cannot be directly edited by a CAx application other than those available from the vendor or licensed by the vendor. Typically, a conversion process is required for a CAx application from another vendor to edit the engineering object. The conversion process may result in the loss of data.

At step 320 one or more of the systems described herein may store an operations log for the engineering object on a collaborative CAx server. For example, at step 320 collaborative CAx server 210 may, as part of computing device 200 in FIG. 2, store an operations log of the engineering object on a collaborative CAx server 210. The operations log may be stored in a collaborative database 215, and may include one or more feature definitions, such as feature definition 220.

As used herein, the phrase "operations log" generally refers to a log of CAx operations that may or may not be associated with a single proprietary CAx application. For example, the operations log may be a vendor-neutral log of feature definitions that facilitates collaborate editing between various proprietary CAx applications.

Collaborative CAx server 210 may store an operations log of the engineering object in various ways. In one embodiment, the operations log of the engineering object comprises a log of sequentially-generated feature definitions. The engineering object may be reconstructed within various CAx applications by regenerating the features comprising the engineering object in sequence. The feature definitions within the operations log may be readily translatable to editing commands within each CAx application by a synchronization module 250 associated therewith.

The operations log of the engineering object may include references to features within the proprietary representation of the engineering object. For example, as depicted in FIG. 2, feature definition 220, corresponding to proprietary feature 260 and to feature identifier 265, may have an associated feature reference 225 associating feature definition 220 with proprietary feature 260. In some embodiments, the feature identifier 265, corresponds directly to the feature reference 225. In one embodiment, the feature identifier 265 and the feature reference 225 are identical. Synchronization module 250 may use feature reference 225 to identify the corresponding proprietary feature 260 within proprietary object file 255 via the feature identifier 265. In one embodiment, feature reference 225 is a globally-unique identifier (GUID) associated with proprietary feature 260.

In one embodiment, the proprietary representation of the engineering object corresponds to a point-in-time within the log of sequentially-generated feature definitions. The point in time may correspond to a snapshot or revision marker within the log. In a collaborative CAx editing environment, editing of the engineering object may take place while a client is offline. The sequentially-generated feature definitions may continue to be created in the operations log of the engineering object. When the client reconnects with the operations log of the engineering object, subsequently-generated feature definitions created after the point-in-time are applied to the proprietary representation to synchronize the proprietary representation with the operations log.

Returning to FIG. 3, at step 330 one or more of the systems described herein may detect creation of a feature of the engineering object within the proprietary CAx application. For example, at step 330 collaborative CAx synchronization module 250 may, as part of CAx client 240 in FIG. 2, detect creation of a feature of the engineering object within the proprietary CAx application. For example, collaborative CAx synchronization module 250 may detect creating of proprietary feature 260 in proprietary object file 255.

The collaborative CAx synchronization module 250 may detect creation of a feature of the engineering object within the proprietary CAx application in any suitable manner. In one embodiment, the collaborative CAx synchronization module is a plugin for the CAx application, and detects creation of a feature of the engineering object using an application programming interface (API) provided by the CAx application to permit additional functions to execute when a feature is created.

At step 340 of FIG. 3, one or more of the systems described herein may insert a feature identifier corresponding to the feature within the proprietary representation of the engineering object. For example, at step 340 synchronization module 250 may, as part of CAx client 240 in FIG. 2, insert feature identifier 265 corresponding to proprietary feature 260 within the proprietary representation of the engineering object stored in proprietary object file 255.

As used herein, the phrase "feature identifier" generally refers to a data item that relates a proprietary feature in a proprietary object file to a feature definition in a collaborative database. In one embodiment, the feature identifier is the index of the feature definition record in the collaborative database.

In one embodiment, the feature identifier is stored in a parameter for the feature within the proprietary representation of the engineering object. By storing the feature identifier within the proprietary representation of the engineering object, the relationship between the proprietary feature and the corresponding feature definition within the operations log is persistent between editing sessions on the CAx client. The feature identifier may be a globally unique identifier. In some embodiments, the feature identifier is represented in a text format to facilitate storage and retrieval within various CAx applications.

Figure 4:
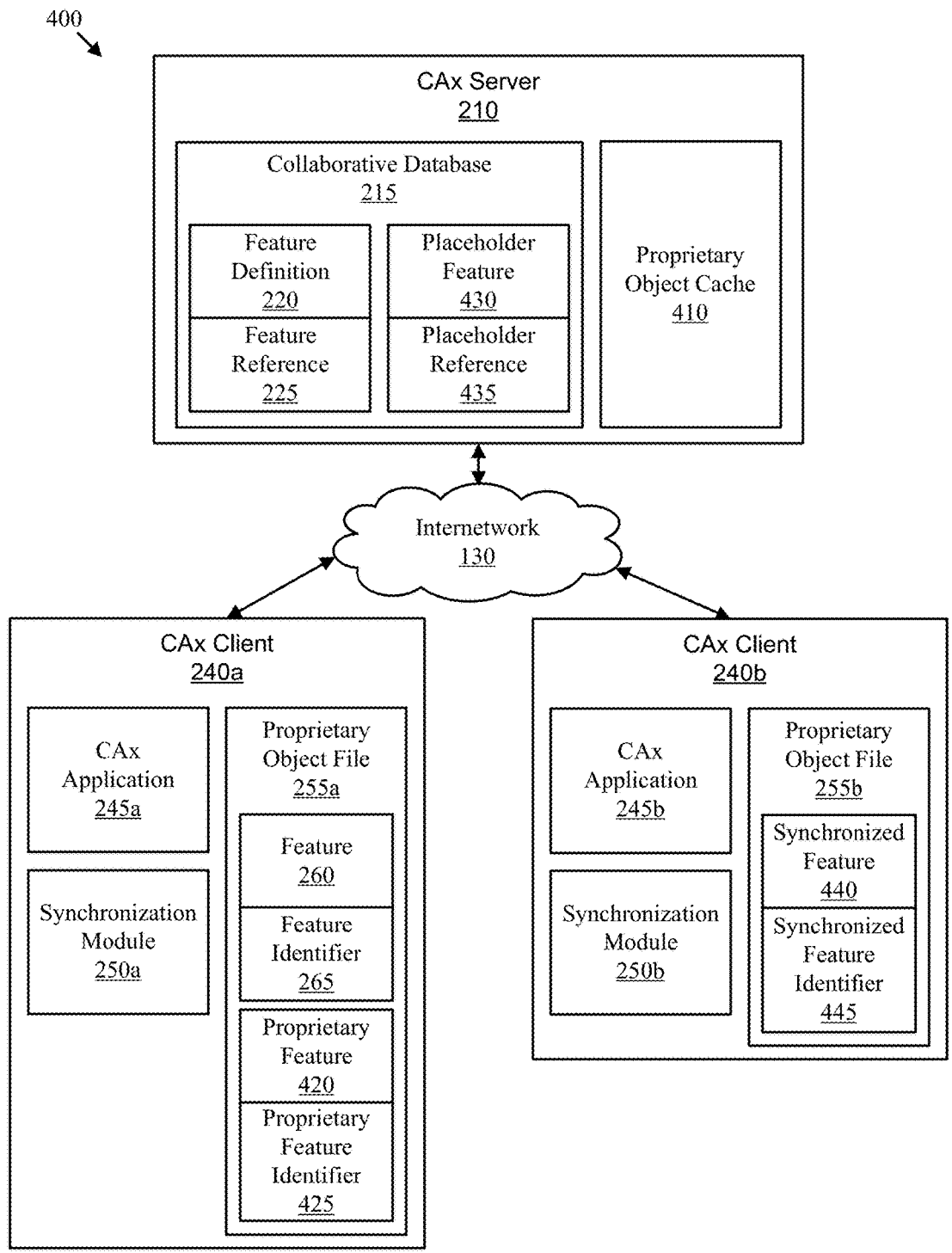
FIG. 4 is a schematic diagram of one example of a collaborative CAx editing system.

FIG. 4 is a schematic diagram of one example of a collaborative CAx editing system 400 that is consistent with one or more embodiments of the claimed invention. In addition to the internetwork 130 of the computing and communications infrastructure 100 of FIG. 1 and modules of the collaborative CAx editing system 200 of FIG. 2, collaborative CAx editing system 400 includes a second CAx client. Corresponding modules of the two CAx clients 240 are appended with reference letters 'a' and 'b.'

In one embodiment, the proprietary representation and the operations log of the engineering object may be cached by the collaborative CAx server. For example, as part of collaborative CAx editing system 400 in FIG. 4, CAx server 210 may cache the proprietary representation of the engineering object in proprietary object cache 410. Regenerating a proprietary representation of an engineering object from sequentially-generated feature definitions in an operations log of the object may be a computationally-intensive and time-consuming process. Caching the proprietary representation of the engineering object on the CAx server with the operations log accelerates the loading of the engineering object on a CAx client on which the proprietary representation is usable by the CAx client and has not yet been loaded into memory (such as following a system crash of the CAx client, or when a new CAx client is added to the collaborative editing system).

In one embodiment, the proprietary representation of the engineering object may be provided to another (a second) CAx client. When the second CAx client adds or changes a feature in the proprietary representation, an instance of the collaborative CAx synchronization module corresponding to the second client may communicate the feature identifier and a corresponding feature definition to the CAx server. The collaborative CAx synchronization module (associated with the first CAx client) may then receive a feature identifier and the feature definition corresponding to the feature created the second CAx client and create a corresponding local feature. For example, as part of collaborative CAx editing system 400, synchronization module 250b on CAx client 240b may create feature definition 220 in collaborative database 215 on CAx server 210. CAx server 210 may notify synchronization module 250a on CAx client 240a of the new feature in the collaborative database 215. Synchronization module 250a may then create synchronized feature 440 in proprietary object file 255a on CAx client 240a, corresponding to feature 260 in proprietary object file 255b on CAx client 240b.

In some embodiments, the CAx synchronization module may initiate insertion of a placeholder feature and corresponding feature reference within the operations log of the engineering object for features not directly supported by the operations log of the engineering object. For example, as depicted in collaborative editing system 400 in FIG. 4, proprietary feature 420 may be created in proprietary object file 255a on CAx client 240a. Synchronization module 250a may initiate creation of placeholder feature 430 and associated placeholder reference 435 in collaborative database 215 on CAx server 210. Features represented by a placeholder may not be editable by another CAx application, but the placeholder reference 435 maintains an association between the database record for placeholder feature 430 and the proprietary representation of the data in the proprietary object file 255a. Placeholder features may be referenced by other features. For example, a sheet body that could not be created or edited in collaborative database 215 may be represented by a placeholder feature and referenced by a split body feature.

As explained above, the collaborative CAx system may associate features in a proprietary representation of an engineering object with corresponding feature definitions in an operations log of the engineering object. A synchronization module, which may be a plug-in to a CAx application executing on a CAx client, may synchronize features between the proprietary and operations logs of the engineering object. As new features are created and edited on one CAx client and synchronized to the vendor-neutral database, synchronization modules on other CAx clients may synchronize the features from the vendor-neutral database to local copies of the proprietary representation of the engineering object.

The collaborative CAx editing system may maintain identifiers and references associating the proprietary and operations log representations of features of the engineering object in non-transitory storage, to prevent the loss of data in the event of system failure of either a CAx client or the CAx server. Caching the proprietary representation of the engineering object in a proprietary object cache on the CAx server may facilitate faster recovery from the system failure of a CAx client.

The proprietary representation of an engineering object may be a "checkpoint" or point-in-time within a sequence of feature definitions created in operations log. The synchronization module may bring the proprietary representation "up to date" by creating features in the proprietary representation that were created in the operations log subsequent to the point-in-time represented by the proprietary representation.

Figure 5:
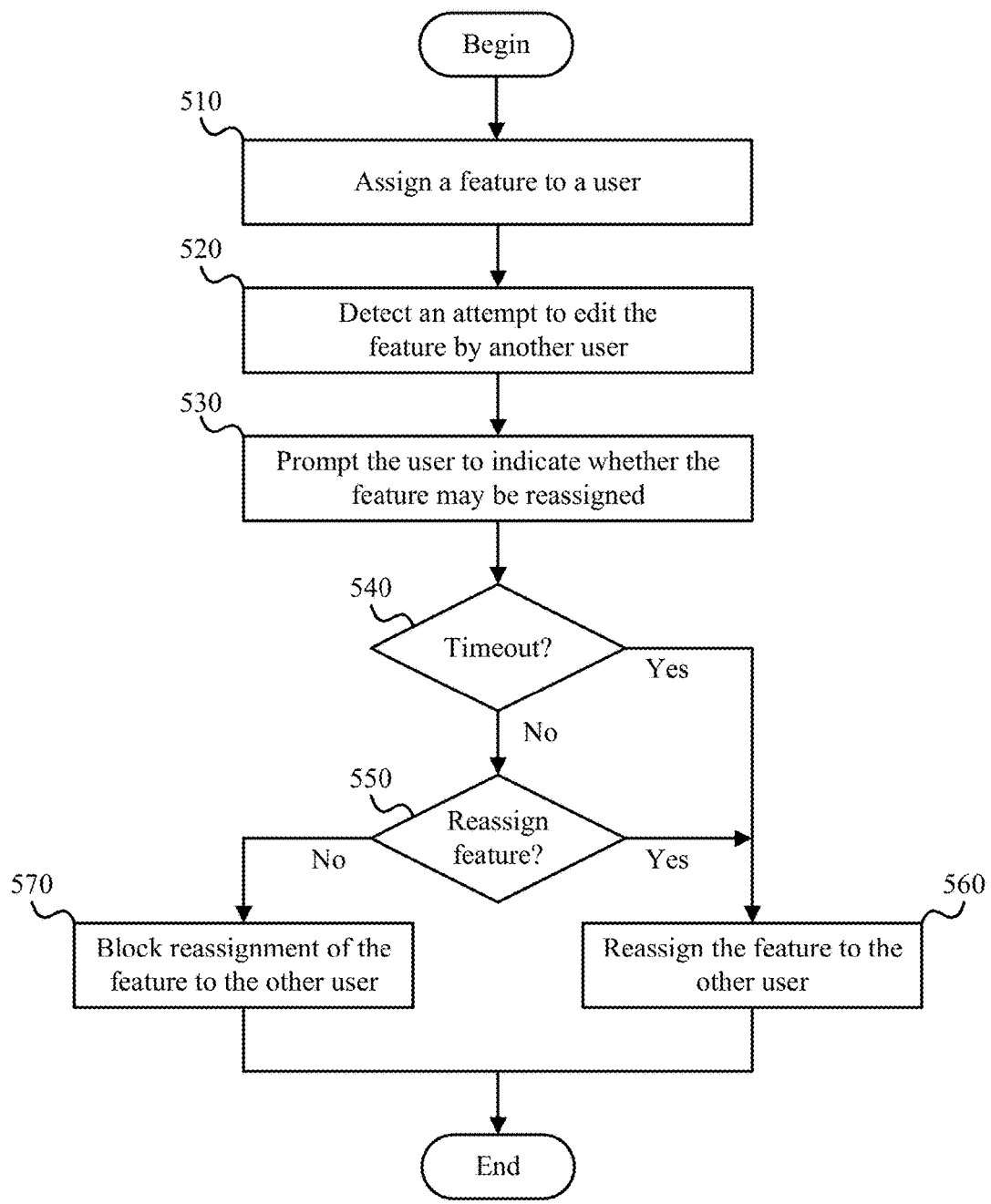
FIG. 5 is a flowchart diagram of one example of a first conflict management method for multi-user CAx editing.
Figure 6:
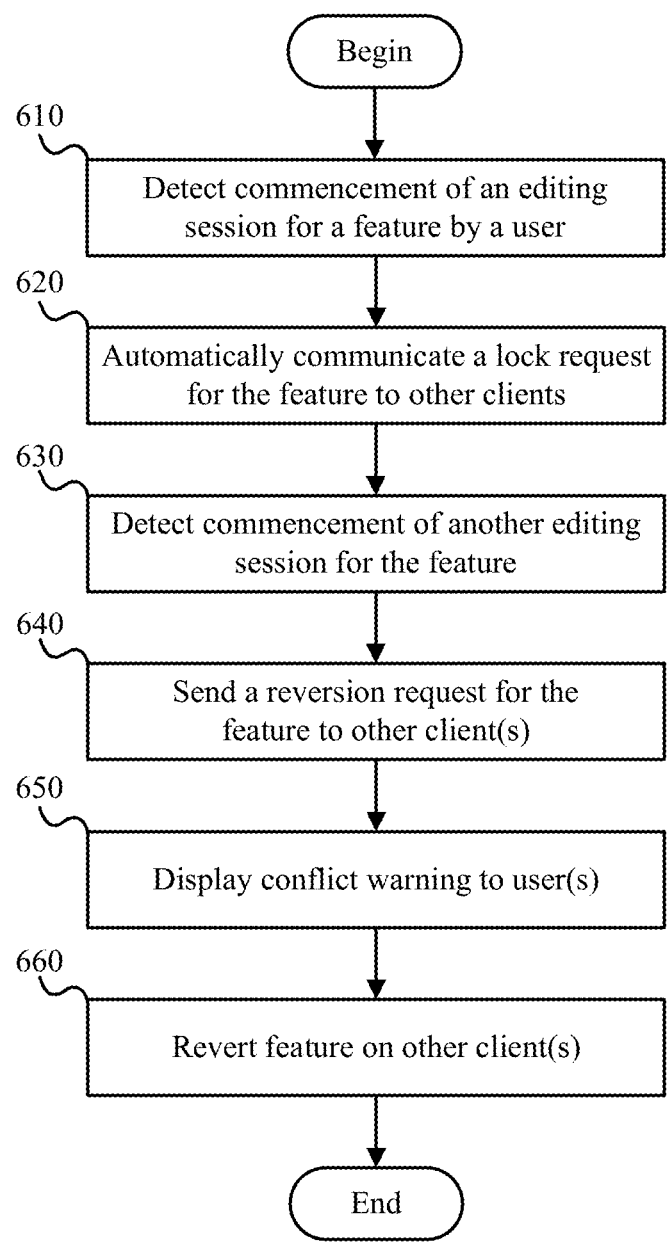
FIG. 6 is a flowchart diagram of one example of a second conflict management method for multi-user CAx editing.
Figure 7:
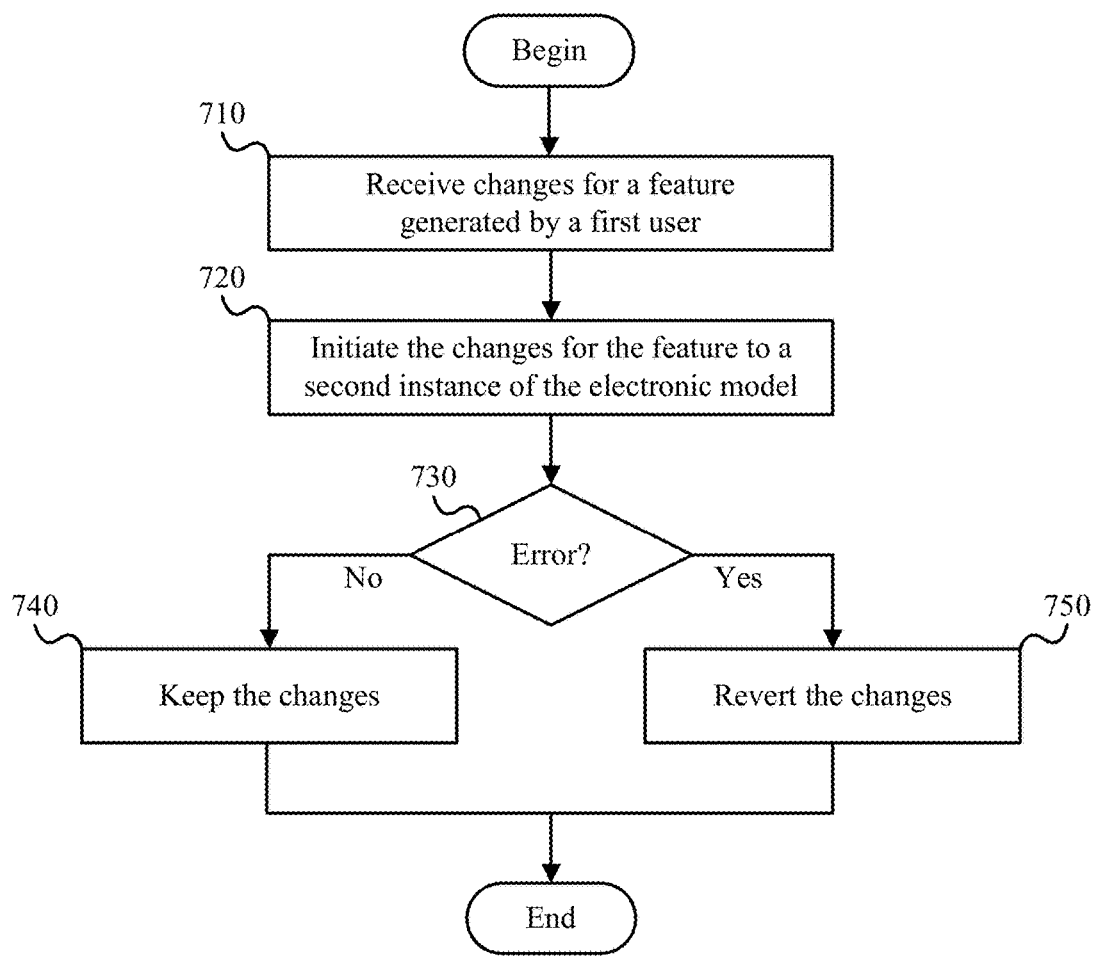
FIG. 7 is a flowchart diagram of one example of a third conflict management method for multi-user CAx editing.

FIGS. 5-7 depict several CAx conflict management methods that may be conducted in conjunction with the collaborative CAx editing systems 200 and 400, or the like, including collaborative CAx editing systems described in commonly assigned co-pending U.S. patent application Ser. No. 14/298,232 entitled "SYSTEM, METHOD, AND APPARATUS FOR COLLABORATIVE CAX EDITING" filed on 25 Nov. 2013 and Ser. No. 13/790,556 entitled "Multi-User Decomposition of Design Space Models" filed on 8 Mar. 2013. Each of these applications is incorporated herein by reference in their entirety. The conflict management methods depicted in FIGS. 5-7 and described herein prevent the corruption or loss of data in shared CAx data files and databases such as the collaborative database 215 and the proprietary object files 255.

FIG. 5 is a flowchart diagram of one example of a conflict management method 500 for multi-user CAx editing. As depicted, the conflict management method 500 includes assigning 510 a feature to a user, detecting 520 an attempt to edit the feature by another user, prompting 530 the user, testing 540 if a timeout has occurred, determining 550 if the feature may be reassigned, reassigning 560 the feature to the other user, and blocking 570 reassignment of the feature.

Assigning 510 a feature to a user may include detecting that a first user has begun to edit a feature, or requested access to a feature, and assigning that feature to the first user. In some embodiments, each client 240 within the collaborative CAx system 200 detects access to features within a local instance of an electronic model and sends a message to the collaborative server 210 indicating that the user has begun to edit the feature. The access may be detected by a plugin module (not shown) for the CAx application 245 that resides on a client. In response to the message, the collaborative server 210 may assign the feature to the user and record the assignment in an assignment table or the like. In some embodiments, the assignment is communicated to each client 240 within the collaborative CAx system 200.

Detecting 520 may include detecting that a second user has begun to edit the feature, or requested access to the feature, and determining if the feature has been assigned to another user. Detecting may occur similarly to the detecting phase in operation 510. In some embodiments, the assignment table is used to see if the feature the second user had begun to edit, or requested, has already been assigned to another user.

Prompting 530 the user may include prompting the first user with a dialog box having an option to relinquish exclusive access to the feature to the second user as well as an option to not relinquish exclusive access. In some embodiments, the second user is provided with visual or audio feedback indicating a potential conflict, such as a dialog box notice and/or a change in color of the rendering of the feature on the display. The logic controlling the display of the prompt may operate on the client 240 or on the collaborative server 210.

Testing 540 if a timeout has occurred may include monitoring the prompt given to the first user to see if a selection has been indicated within a selected time period. The period for a selection may be timed using a software timer, or by monitoring an internal clock until a selected value is reached, or by any other method known to those of skill in the art. The logic measuring the timeout period may reside in software that runs on the client 240 or on the collaborative server 210.

Determining 550 if the feature may be reassigned may include checking the result of the user prompt to see if the user has indicated a refusal to allow reassignment of the feature, or if the user has indicated allowance of the request, or made no response within the selected time interval. A non-response within the time interval, or an allowance response, may both result in an indication to reassign the feature.

Reassigning 560 the feature to the other user may include modifying the assignment table, or the like, to reflect that the second user has been assigned the feature. Reassigning may also include prompting the second user with a dialog or the like, indicating that the feature has been assigned to them. Reassigning may also include prompting the first user to confirm reassignment of the feature, particularly in the case where the reassignment was due to a timeout condition instead of a user selection. Blocking 570 reassignment of the feature may include alerting the second user that the assignment request was rejected by the first user. Blocking may also include confirming to the first user that the feature is still assigned to them.

FIG. 6 is a flowchart diagram of one example of a conflict management method 600 for multi-user CAx editing. As depicted, the conflict management method 600 includes detecting 610 commencement of an editing session for a feature by a user, communicating 620 a lock request for the feature to other clients, detecting 630 commencement of another editing session for the feature, sending 640 a reversion request for the feature to other client(s), displaying 650 a conflict warning to user(s), and, reverting 660 feature on other client(s).

Detecting 610 commencement of an editing session for a feature by a user may include receiving a communications from a first client 240 indicating a first user has selected a feature to edit. In one instance the communications may be transferred over the inter-network 130 from the client 240 to the collaborative server 210. Each client may be configured to send out automated messages indicating the local user has initiated an editing session for a feature without requiring any additional action by the user. The collaborative server 210 may assign the feature to the user and record the assignment in an assignment table or the like.

Communicating 620 a lock request for the feature to other client(s) may include sending a message to one or more client(s) 240 indicating the feature that will be locked on each of the client(s) that receive the message. Detecting 630 commencement of another editing session for the feature may include receiving a communications from a second client 240 indicating that a second user has begun to edit a feature.

Sending 640 a reversion request for the feature to other client(s) may include determining if the feature edited by a subsequent user is the same as the feature edited by the first user, and if so sending a communication such as a reversion request message to the other client(s) corresponding to the subsequent user(s) requesting that the editing session be aborted and the feature be reverted to a pre-editing state.

Displaying 650 a conflict warning to user(s) may include displaying a dialog box informing subsequent user(s) that the editing session was in conflict with the first user's editing session. Reverting 660 feature on other client(s) may include reverting the feature to the state it was before as before the editing session commenced, in response to receiving the reversion request message.

FIG. 7 is a flowchart diagram depicting one example of a conflict management method 700 for multi-user CAx editing. As depicted, the conflict management method 700 includes receiving 710 changes for a feature generated by a first user, initiating 720 the changes for the feature to a second instance of the electronic model, reverting 730 the changes if they result in an error, and, keeping 740 the changes if they don't result in an error.

Receiving 710 changes for a feature generated by a first user may include receiving a communication from a first client 240 indicating the user has made one or more changes to a feature of the electronic model. In one embodiment the communications may be transferred over the inter-network 130 from the client 240 to the collaborative server 210. In some embodiments, the client is configured to automatically send messages indicating the user has made a change without requiring any additional action by the user.

Initiating 720 the changes for the feature to a second instance of the electronic model may include communicating the change(s) to a client 240 that manages the second instance of the model, and having that client make the requested change(s). In some embodiments, the collaborating server also maintains a master instance of the model and also makes the requested changes.

Reverting 730 the changes if they generate an error may include determining if an error resulted from the changes to the feature on the second instance and/or the master instance, and if so, reversing the changes locally, and communicating a reversion request to the first client. In response thereto, the first client may revert the changes to the feature. Keeping 740 the changes if they don't generate an error may include leaving the changes to the electronic model in place. In one embodiment, a message is sent to the collaborating server confirming that the changes did not generate an error.

The various elements of the systems, methods, and apparatus described herein function cooperatively to manage editing conflicts and facilitate productive collaborative CAx editing. The preceding depictions are intended to be illustrative rather than definitive. Similarly, the claimed invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A system comprising:
  a plurality of editing clients comprising at least one processor and provided with software that enables a user of each editing client to edit a local instance of a model of a manufacturable object, wherein the model of the manufacturable object comprises a plurality of features including a first feature; and
  a collaborative editing server comprising at least one processor and provided with software that maintains a master copy of the model of the manufacturable object by:
    a) assigning the first feature to a first user, detecting an attempt to edit the first feature by a second user, requesting permission from the first user to reassign the feature to the second user, and reassigning the first feature to the second user if the first user indicates that the first feature may be reassigned, and
    b) detecting commencement of a first editing session for the first feature by a first user editing a first instance of the model, detecting commencement of a second editing session for the first feature by a second user editing a second instance of the model, and sending a reversion request for the first feature to a client corresponding to the second instance in response to detecting commencement of the second editing session previous to detecting completion of the first editing session, and
    c) receiving changes for the first feature that are generated by a first user editing a first instance of the electronic model, initiating the changes for the feature within a second instance of the electronic model edited by a second user, and initiating reversion of the changes for the first feature within the first instance of the electronic model in response to determining that the changes to the feature within the second instance of the electronic model generated an error.

2. The system of claim 1, wherein an editing client of the plurality of editing clients prompts an assigned user to indicate whether a feature may be reassigned to another user.

3. The system of claim 2, wherein the collaborative editing server blocks reassignment of a feature if the assigned user indicates that the feature may not be reassigned.

4. The system of claim 2, wherein the collaborative editing server reassigns the feature to another user if the assigned user fails, within a selected time interval, to indicate whether the feature may be reassigned.

5. The system of claim 1, wherein the collaborative editing server or an editing client of the plurality of editing clients initiates reversion of changes to a feature within a client instance of the electronic model in response to determining that initiating the changes to the feature within the master instance of the electronic model generated an error.

6. A computer-implemented method comprising:
  assigning a feature of a model of a manufacturable object to a first user;
  detecting an attempt to edit the feature by a second user;
  requesting permission from the first user to reassign the feature to the second user; and
  reassigning the feature to the second user if the first user indicates that the feature may be reassigned.

7. The computer-implemented method of claim 6, comprising blocking reassignment of the feature if the first user indicates that the feature may not be reassigned.

8. The computer-implemented method of claim 6, comprising prompting the first user to indicate whether the feature may be reassigned.

9. The computer-implemented method of claim 8, comprising reassigning the feature to the second user if the first user fails, within a selected time interval, to indicate whether the feature may be reassigned.

10. A computer-implemented method comprising:
  detecting commencement of a first editing session for a feature of an electronic model of a manufacturable object by a first user editing a first instance of the electronic model;
  detecting commencement of a second editing session for the feature by a second user editing a second instance of the electronic model;
  sending a reversion request for the feature to a client corresponding to the second instance in response to detecting commencement of the second editing session previous to detecting completion of the first editing session.

11. The computer-implemented method of claim 10, comprising automatically communicating a lock request for the feature to the client corresponding to the second editing instance in response to detecting the commencement of the second editing session.

12. The computer-implemented method of claim 11, comprising reverting the feature within the second instance.

13. The computer-implemented method of claim 10, comprising displaying a conflict warning to the first user or the second user.

14. A computer-implemented method comprising:
  receiving changes for a feature generated by a first user editing a first instance of an electronic model of a manufacturable object;
  initiating the changes for the feature to a second instance of the electronic model edited by a second user; and initiating reversion of the changes for the feature to the first instance of the electronic model in response to determining that the changes to the feature to the second instance of the electronic model generated an error.

15. The computer-implemented method of claim 14, comprising initiating reversion of the changes to the feature within the first instance of the electronic model in response to determining that the changes to the feature within a master instance of the electronic model generated an error.

16. The computer-implemented method of claim 15, wherein the master instance resides on a collaborative server.

17. The computer-implemented method of claim 14, wherein the first instance and the second instance reside on a first client and a second client respectively.

18. The computer-implemented method of claim 14, wherein initiating changes to the feature comprises communicating a modification request.

19. The computer-implemented method of claim 14, wherein the modification request is relayed by a collaborative editing server.

* * * * *